United States Patent
Bottelli et al.

(10) Patent No.: US 7,966,532 B2
(45) Date of Patent: Jun. 21, 2011

(54) METHOD FOR SELECTIVELY RETRIEVING COLUMN REDUNDANCY DATA IN MEMORY DEVICE

(75) Inventors: Aldo Bottelli, Redwood City, CA (US); Luca Fasoli, Campbell, CA (US); Doug Sojourner, Union City, CA (US)

(73) Assignee: SanDisk 3D, LLC, Milpitas, CA (US)

( * ) Notice: Subject to any disclaimer, the term of this patent is extended or adjusted under 35 U.S.C. 154(b) by 245 days.

(21) Appl. No.: 12/414,935

(22) Filed: Mar. 31, 2009

(65) Prior Publication Data

US 2010/0107004 A1    Apr. 29, 2010

Related U.S. Application Data

(60) Provisional application No. 61/108,524, filed on Oct. 26, 2008.

(51) Int. Cl.
*G11C 29/00*    (2006.01)
(52) U.S. Cl. .................... 714/723; 714/710; 714/711
(58) Field of Classification Search .......... 714/710–711, 714/718–723; 365/200–201
See application file for complete search history.

(56) References Cited

U.S. PATENT DOCUMENTS

| | | | |
|---|---|---|---|
| 5,267,213 A | 11/1993 | Sung et al. | |
| 5,917,743 A | 6/1999 | Roy | |
| 6,094,368 A | 7/2000 | Ching | |
| 6,246,616 B1 | 6/2001 | Nagai et al. | |
| 6,367,030 B1 * | 4/2002 | Yamauchi | 714/6.32 |
| 6,396,749 B2 | 5/2002 | Al-Shamma et al. | |
| 6,715,029 B1 | 3/2004 | Trainin et al. | |
| 6,785,169 B1 * | 8/2004 | Nemati et al. | 365/189.07 |
| 6,937,533 B2 * | 8/2005 | Hojo et al. | 365/200 |
| 6,944,073 B2 * | 9/2005 | Sato | 365/200 |

(Continued)

FOREIGN PATENT DOCUMENTS

EP    0590809 A2    4/1994

(Continued)

OTHER PUBLICATIONS

International Search Report & The Written Opinion of the International Searching Authority dated Jan. 7, 2010 in International Application No. PCT/US2009/057996 filed Sep. 23, 2009.

(Continued)

*Primary Examiner* — Jeffrey A Gaffin
*Assistant Examiner* — Steve Nguyen
(74) *Attorney, Agent, or Firm* — Vierra Magen Marcus & DeNiro LLP

(57) ABSTRACT

Column redundancy data is selectively retrieved in a memory device according to a set of storage elements which is currently being accessed, such as in a read or write operation. The memory device is organized into sets of storage elements such as logical blocks, where column redundancy data is loaded from a non-volatile storage location to a volatile storage location for one or more particular blocks which are being accessed. The volatile storage location need only be large enough to store the current data entries. The size of the set of storage elements for which column redundancy data is concurrently loaded can be configured based on an expected maximum number of defects and a desired repair probability. During a manufacturing lifecycle, the size of the set can be increased as the number of defects is reduced due to improvements in manufacturing processes and materials.

20 Claims, 11 Drawing Sheets

U.S. PATENT DOCUMENTS

| | | |
|---|---|---|
| 6,970,368 B1 | 11/2005 | Bautista, Jr. et al. |
| 7,092,289 B1 * | 8/2006 | Wong ........................ 365/185.09 |
| 7,142,471 B2 | 11/2006 | Fasoli et al. |
| 7,236,397 B2 | 6/2007 | Kim |
| 7,369,422 B2 | 5/2008 | Cooke |
| 7,394,690 B2 | 7/2008 | Moogat et al. |
| 7,447,066 B2 | 11/2008 | Conley et al. |
| 7,449,744 B1 * | 11/2008 | Yu et al. ......................... 257/316 |
| 7,539,931 B2 * | 5/2009 | Thayer ........................... 714/797 |
| 7,589,552 B1 * | 9/2009 | Guzman et al. ................. 326/10 |
| 7,710,800 B2 * | 5/2010 | Linzer et al. .................. 365/200 |
| 2008/0184065 A1 | 7/2008 | Thorp et al. |

FOREIGN PATENT DOCUMENTS

| | | |
|---|---|---|
| EP | 1710696 A1 | 10/2006 |

OTHER PUBLICATIONS

Jex et al., Content Addressable Memory for Flash Redundancy, IEEE Pacific Rim Conf. on Communications, Computers and Signal Processing, May 9-10, 1991.

* cited by examiner

Fig. 4b

| Bay 0, 360 | Bay 1, 400 | Bay 2, 410 | Bay 3, 415 |
| --- | --- | --- | --- |
| Bay 4, 420 | Bay 5, 425 | Bay 6, 430 | Bay 7, 435 |
| Bay 8, 440 | Bay 9, 445 | Bay 10, 450 | Bay 11, 455 |
| Bay 12, 460 | Bay 13, 465 | Bay 14, 470 | Bay 15, 475 |

Fig. 8

| | column redundancy data for chip | | |
|---|---|---|---|
| entry | set #/ address of block | address of bad byte | address of redundant byte |
| 1 | 1 | 34 | 1 |
| 2 | 1 | 50 | 2 |
| 3 | 2 | 412 | 1 |
| 4 | 2 | 413 | 2 |
| 5 | 2 | 414 | 3 |
| 6 | 2 | 995 | 4 |
| 7 | 3 | 12 | 1 |
| 8 | 3 | 14 | 2 |
| 9 | 3 | 1469 | 3 |
| ⋮ | | | |

Fig. 9

| | Retrieved column redundancy data when accessing set/block 3 | | |
|---|---|---|---|
| entry | address of block | address of bad byte | address of redundant byte |
| 1 | 3 | 12 | 1 |
| 2 | 3 | 14 | 2 |
| 3 | 3 | 1469 | 3 |

Fig. 10 column redundancy data for chip

| entry | set # | address of block | address of bad byte | address of redundant byte |
|---|---|---|---|---|
| 1 | 1 | 1 | 75 | 1 |
| 2 | 1 | 1 | 349 | 2 |
| 3 | 1 | 2 | 584 | 1 |
| 4 | 1 | 2 | 1200 | 2 |
| 5 | 2 | 3 | 67 | 1 |
| 6 | 2 | 3 | 68 | 2 |
| 7 | 2 | 4 | 185 | 1 |
| 8 | 3 | 5 | 98 | 1 |
| 9 | 3 | 6 | 832 | 1 |

Retrieved column redundancy data when accessing set 2/block 3 or 4

| entry | address of block | address of bad byte | address of redundant byte |
|---|---|---|---|
| 1 | 3 | 67 | 1 |
| 2 | 3 | 68 | 2 |
| 3 | 4 | 185 | 1 |

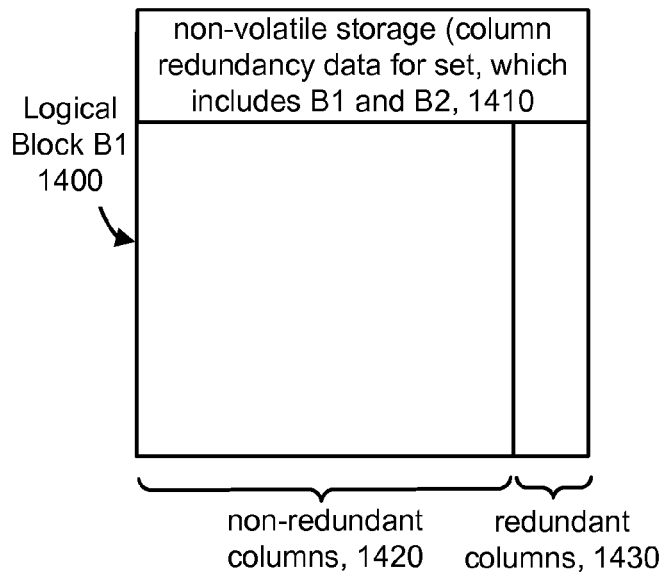
Fig. 14a
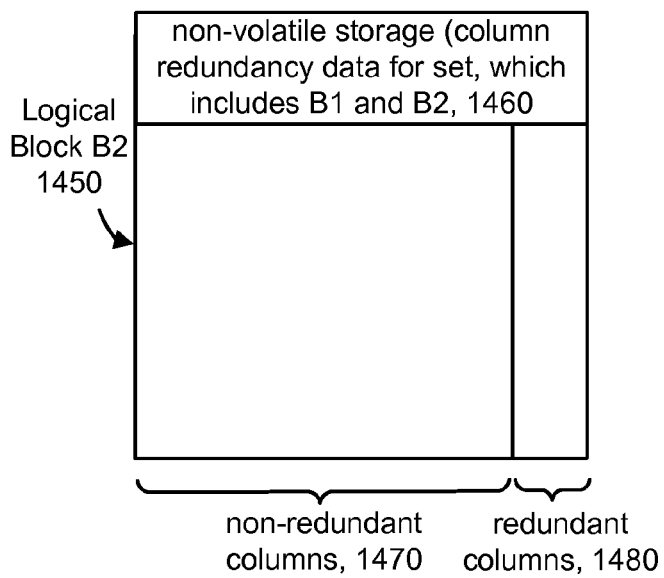
Fig. 14b
Fig. 15
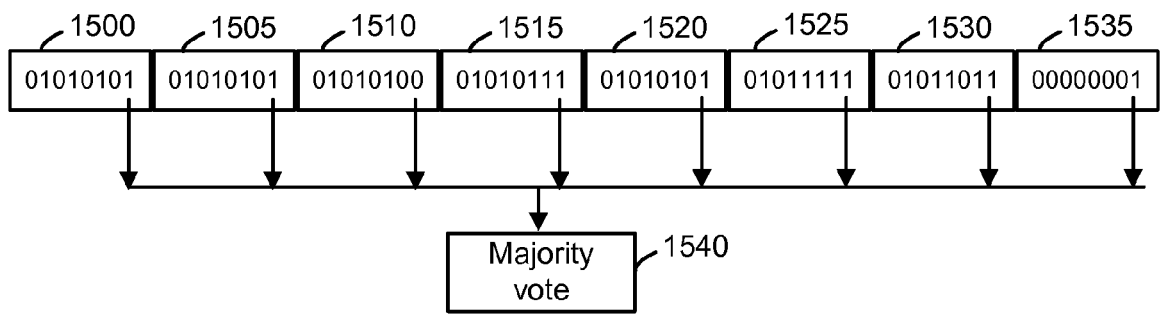

US 7,966,532 B2

METHOD FOR SELECTIVELY RETRIEVING COLUMN REDUNDANCY DATA IN MEMORY DEVICE

CROSS-REFERENCE TO RELATED APPLICATIONS

This application claims the benefit of U.S. provisional patent application No. 61/108,524, filed Oct. 26, 2008, incorporated herein by reference.

BACKGROUND

The present invention relates to technology for data storage.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Non-volatile memories formed from reversible resistance-switching elements are also known. For example, U.S. Patent Application Publication 2006/0250836, published Nov. 9, 2006, and titled "Rewriteable Memory Cell Comprising A Diode And A Resistance-Switching Material," incorporated herein by reference, describes a rewriteable non-volatile memory cell that includes a diode coupled in series with a reversible resistance-switching material such as a metal oxide or metal nitride. These reversible resistance-switching materials are of interest for use in nonvolatile memory arrays. One resistance state may correspond to a data "0," for example, while the other resistance state corresponds to a data "1." Some of these materials may have more than two stable resistance states.

Moreover, various types of volatile memory devices are known, such as DRAM. Further, memory devices can have one layer of storage elements, or multiple layers in so-called 3-D memory devices.

Each memory device is typically tested before being shipped to the end user to identify defective storage elements which are not suitable for storing data. Due to manufacturing variations, a number of such bad storage elements are inevitably identified. Each bad storage element can be marked to prevent access to it. Typically, a number of additional, redundant storage elements are provided for use in place of the bad storage elements. In a column redundancy (CR) approach, a column of storage elements which has one or more bad storage elements is replaced by a redundant column. Column redundancy data which identifies the bad columns and the respective redundant columns can be stored in the memory device. When the memory device is powered up, the column redundancy data is transferred to a working memory location of the device, such as CAM (Content Addressable Memory). However, the size of the CAM is proportionate to the amount of redundancy information which is stored for the memory device. As a result, precious space in the memory device is consumed by the column redundancy data stored in the volatile memory (CAM).

Techniques are needed for reducing the amount of space in a memory device which is needed to store column redundancy data, while still maintaining the same redundancy coverage.

SUMMARY

A technique for operating a memory device is provided which reduces the amount of space in the memory device which is needed to store column redundancy data.

In one embodiment, a method is provided for operating a memory device which includes, in response to a request to access storage elements in a particular set of storage elements of the memory device, loading byte redundancy data for the particular set from a non-volatile storage location of the memory device to a volatile storage location of the memory device, without loading byte redundancy data for other sets of storage elements of the memory device. The method further includes accessing the storage elements in the particular set using the byte redundancy data for the particular set.

In another embodiment, a method is provided for operating a memory device which includes receiving a request to access a particular set of storage elements of the memory device, where the request includes an address of the particular set which distinguishes the particular set from other sets of storage elements of the memory device. The method further includes, in response to the request, and based on the address of the particular set, accessing the byte redundancy data of the particular set without accessing byte redundancy data of the other sets. The method further includes accessing the particular set using the byte redundancy data of the particular set.

In another embodiment, a method for configuring memory devices includes determining a first expected maximum number N1 of storage element defects for a first memory device, and configuring the first memory device to load byte redundancy data each time a different set of storage elements of the first memory device is subsequently accessed in at least one of a read operation and a write operation, a size S1 of each set of storage elements of the first memory device is based on N1.

In another embodiment, a memory device includes a set of non-volatile storage elements which is formed on a substrate, a non-volatile storage location of the memory device which stores byte redundancy data for the memory device, a volatile storage location of the memory device, and one or more control circuits. The one or more control circuits, in response to a request to access a particular set of storage elements of the memory device, load byte redundancy data for the particular set from the non-volatile storage location to the volatile storage location, without loading byte redundancy data for other sets of storage elements of the memory device. The one or more control circuits access the particular set using the byte redundancy data for the particular set.

Corresponding methods, systems and computer- or processor-readable storage devices which have executable code for performing the methods provided herein may also be provided.

BRIEF DESCRIPTION OF THE DRAWINGS

FIG. 4b depicts an example of storage elements arranged in sixteen bays in a 3-D memory device.

FIG. 8 provides an example of column redundancy data for an entire memory chip which is arranged in a set size of one block, for purposes of loading the column redundancy data.

FIG. 9 provides an example of retrieved column redundancy data for set/block 3, referred to in FIG. 8.

FIG. 10 provides an example of column redundancy data for an entire memory chip which is arranged in a set size of two blocks, for purposes of loading the column redundancy data.

FIG. 11 provides an example of retrieved column redundancy data for set 2/blocks 3 and 4, referred to in FIG. 10.

FIG. 14a depicts a first logical block which stores column redundancy data for first and second blocks.

FIG. 14b depicts a second logical block which stores column redundancy data for first and second blocks.

FIG. 15 depicts a majority voting process for CR data.

DETAILED DESCRIPTION

A technique for operating a memory device is provided which reduces the amount of space in the memory device which is needed to store column redundancy data.

Figure 1:
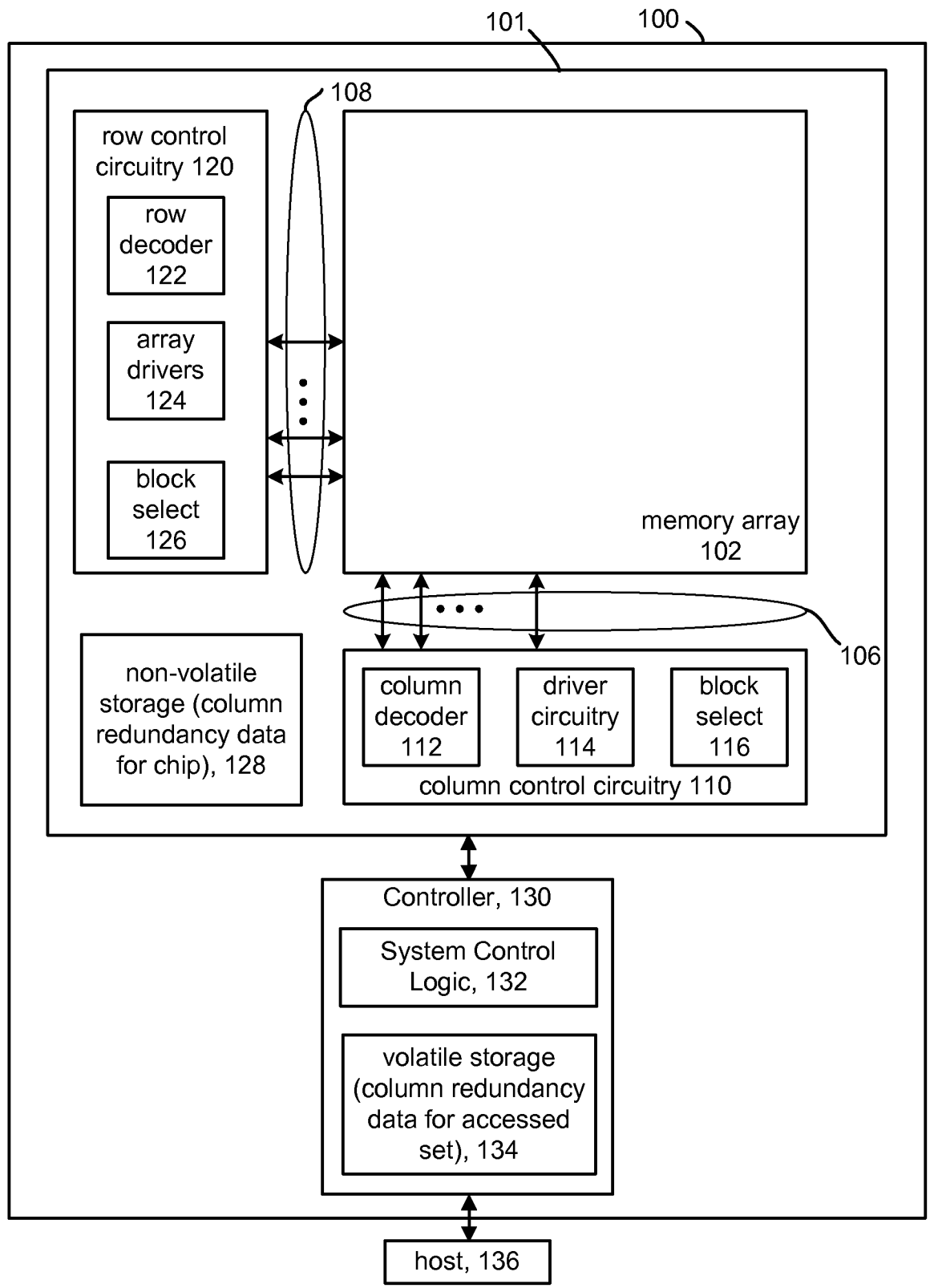
FIG. 1 is a block diagram of one embodiment of a memory system.

FIG. 1 is a block diagram that depicts one example of a memory system 100 that can implement the technology described herein. The memory system 100 may be configured as a card or other package which includes a portion 101 formed on a die and an off-chip controller 130 which communicates with an external host 136, in one possible approach. The controller 130 includes system control logic 132 and a volatile storage 134 such as a CAM for storing column redundancy data for an accessed set or unit of storage elements. A non-volatile storage location 128 stores column redundancy data for the entire memory device, in one approach, and can be provided, e.g., as part of a memory array 102, in one or more specified pages of storage elements, or in ROM or flash fuses.

The memory array 102 can be a two or three dimensional array of memory cells, also referred to as storage elements. In one implementation, memory array 102 is a monolithic three dimensional memory array. A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory arrays.

In another possible implementation, the memory array is a two-dimensional array of non-volatile storage elements which are series-connected in strings, such as NAND strings. Each string extends in a column between drain- and source-side select gates. Word lines communicate with control gates of the storage elements in rows. Bit lines communicate with the drain end of each string, and sensing components are coupled to the bit lines to determine whether a selected storage element is in a conductive or non-conductive state.

The array terminal lines of memory array 102 include the various layer(s) of word lines organized as rows, and the various layer(s) of bit lines organized as columns. However, other orientations can also be implemented.

Memory system 100 includes row control circuitry 120, whose outputs 108 are connected to respective word lines of the memory array 102. Row control circuitry 120 receives a group of row address signals and one or more various control signals from system control logic circuit 130, and typically may include such circuits as row decoders 122, array terminal drivers 124, and block select circuitry 126 for both read and programming operations. Memory system 100 also includes column control circuitry 110 whose input/outputs 106 are connected to respective bit lines of the memory array 102. Column control circuitry 110 receives a group of column address signals and one or more various control signals from system control logic 130, and typically may include such circuits as column decoders 112, array terminal receivers or drivers 114, block select circuitry 116, as well as read/write circuitry, and I/O multiplexers. System control logic 130 receives data and commands from the host 136 and provides output data to the host. In other embodiments, system control logic 130 receives data and commands from a separate controller circuit and provides output data to that controller circuit, with the controller circuit communicating with the host. System control logic 130 may include one or more state machines, registers and other control logic for controlling the operation of the memory system 100 as described herein.

In one embodiment, all of the components depicted in FIG. 1 are arranged on a single integrated circuit. For example, system control logic 130, column control circuitry 110 and row control circuitry 120 are formed on the surface of a substrate. Moreover, memory array 102 can be a monolithic three dimensional memory array formed above the substrate (and, therefore, above system control logic 130, column control circuitry 110 and row control circuitry 120). In some cases, a portion of the control circuitry can be formed on the same layers as some of the memory array.

Integrated circuits incorporating a memory array usually subdivide the array into a number of sub-arrays or blocks. As frequently used, a sub-array is a contiguous group of memory cells having contiguous word and bit lines generally unbroken by decoders, drivers, sense amplifiers, and input/output circuits. This is done for a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. Further, greater reliability can be achieved by storing data redundantly in different sub-arrays, so that if a defect such as a break in a word line occurs in one sub-array, it will not affect another sub-array whose word line is a different conductive path. Moreover, different voltage drivers and other peripheral components can be provided for the different sub-arrays, again to improve reliability.

Nonetheless, for ease of description, an array may also be used synonymously with sub-array to refer to a contiguous group of memory cells having contiguous word and bit lines generally unbroken by decoders, drivers, sense amplifiers, and input/output circuits. An integrated circuit may include one or more memory arrays. The controller 130 and any of the other components, besides the memory array 102, may be considered to be control circuits.

During the manufacturing and die sort process, the storage elements of the memory array 102 are tested, and defective storage elements are identified. Columns of storage elements which include one or more defective storage elements are replaced by redundant or extra columns of storage elements, in a technique referred to as column redundancy. A column can represent a set of storage elements which are associated with one or more bit lines. Typically, data is written and read in units of bytes, in which case the column redundancy technique can be implemented as a byte redundancy technique. Further, the number of storage elements on a word line which are used to store a byte of data can vary based on the number of bits which are stored in each storage element. For example, with two-bits per storage elements, four storage elements are needed to store a byte. With four bits per storage elements, two storage elements are needed to store a byte. With eight bits per storage elements, one storage element is needed to store a byte. With sixteen bits per storage element, one storage element stores two bytes, and so forth. Thus, for each defective storage element, an entire column of storage elements which includes the defective storage element is remapped to a redundant column of storage elements.

Figure 2:
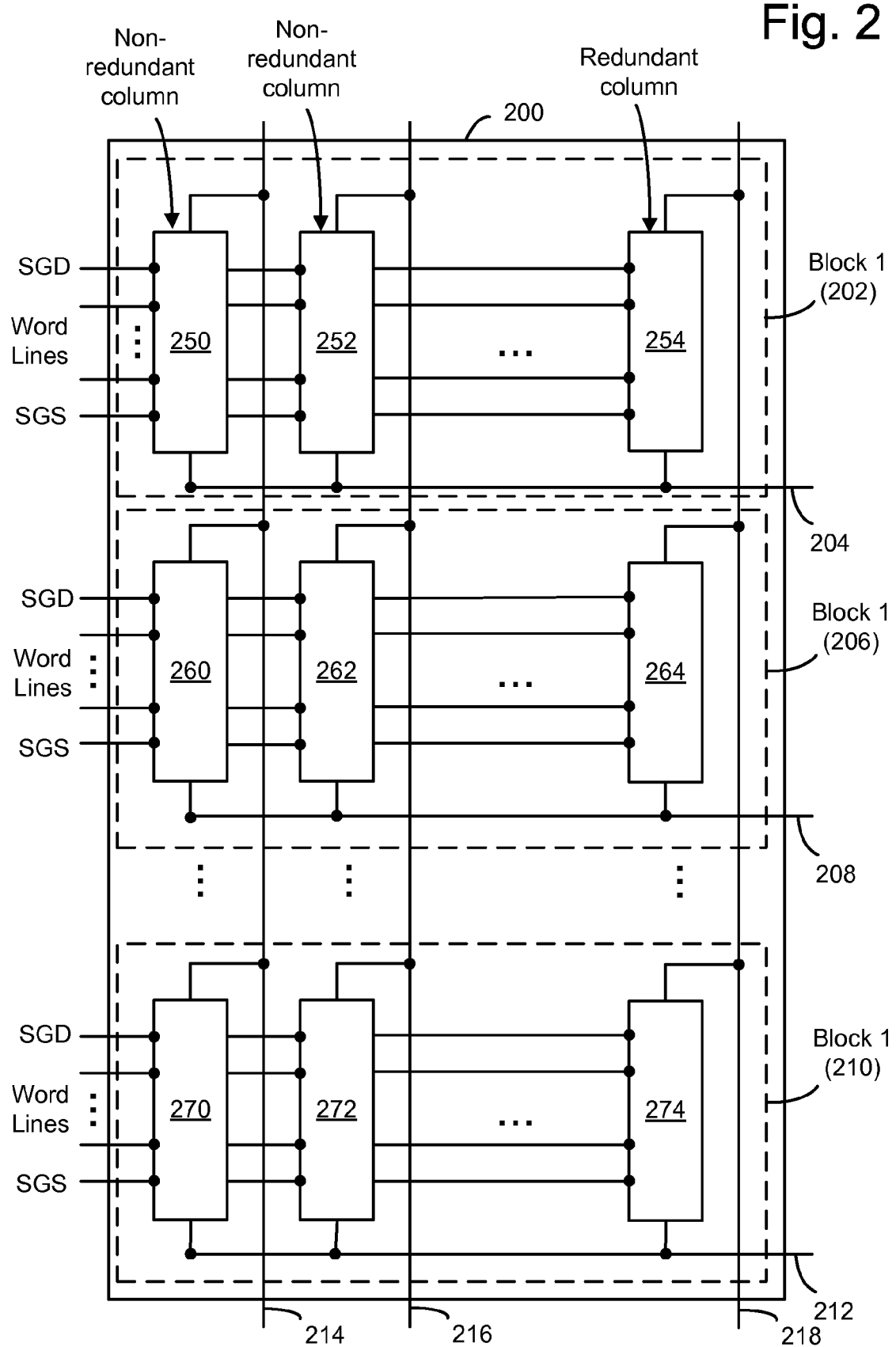
FIG. 2 illustrates an example of an array of NAND storage elements arranged in blocks of NAND strings.

FIG. 2 illustrates an example of an array 200 of NAND storage elements arranged in blocks of NAND strings. A NAND string includes a set of series-connected non-volatile storage elements arranged between a drain select gate (SGD) and a source select gate (SGS). The drain select gate is connected to a bit line and the source select gate is connected to a source line. A NAND block includes a set of NAND strings which are associated with common set of word lines, SGD line and SGS line. A block can be defined differently for different types of memory devices. Furthermore, a logical block and a physical block can be defined, where a logical block includes one or more physical blocks, depending on the type of memory device. In a NAND memory device, a logical block is typically the same as a physical block. In contrast, in some memory devices such as some 3-D devices, a logical block is not the same as a physical block, as discussed further in connection with FIGS. 4a, 4b, 5a and 5b. A "block" as used herein is generally meant to refer to a logical block unless otherwise indicated.

For example, referring still to the NAND device of FIG. 2, block 202 includes NAND strings 250, 252, ..., 254, block 206 includes NAND strings 260, 262, ..., 264, and block 210 includes NAND strings 270, 272, ..., 274. As an illustration, each of NAND strings 250, 252, 260, 262, 270 and 272 is a non-redundant column, and each of NAND strings 254, 264 and 274 is a redundant column. In NAND memory, byte redundancy uses columns in different physical blocks that share the same bit line. Thus, NAND strings 264 and 274 will also be used as redundant columns with NAND string 254.

Along each column of the array 200, a common bit line is coupled to the drain terminal of the drain select gate for a NAND string in each block. For example, a bit line 214 is connected to NAND strings 250, 260 and 270, a bit line 216 is connected to NAND strings 252, 262 and 272, and a bit line 218 is connected to NAND strings 254, 264 and 274. Source lines 204, 208 and 212 are provided for blocks 202, 206 and 210, respectively. In each block of NAND strings, the respective source line connects all the source terminals of the source select gates of the NAND strings. Each block can be considered to be a memory array which includes non-redundant columns of storage element and redundant columns of storage elements.

The array of storage elements is divided into many blocks. For NAND devices, the block is the unit of erase. Each NAND block is typically divided into a number of pages. A page is the smallest unit of programming. One or more pages of data are typically stored in one row of storage elements. For example, a row typically contains several interleaved pages or it may constitute one page. All storage elements of a page will be read or programmed together. A large number of pages form a block, anywhere from 8 pages, for example, up to 32, 64 or more pages. In some embodiments, a row of NAND strings comprises a block. Multiple blocks may be provided in a plane of a memory device.

Figure 3:
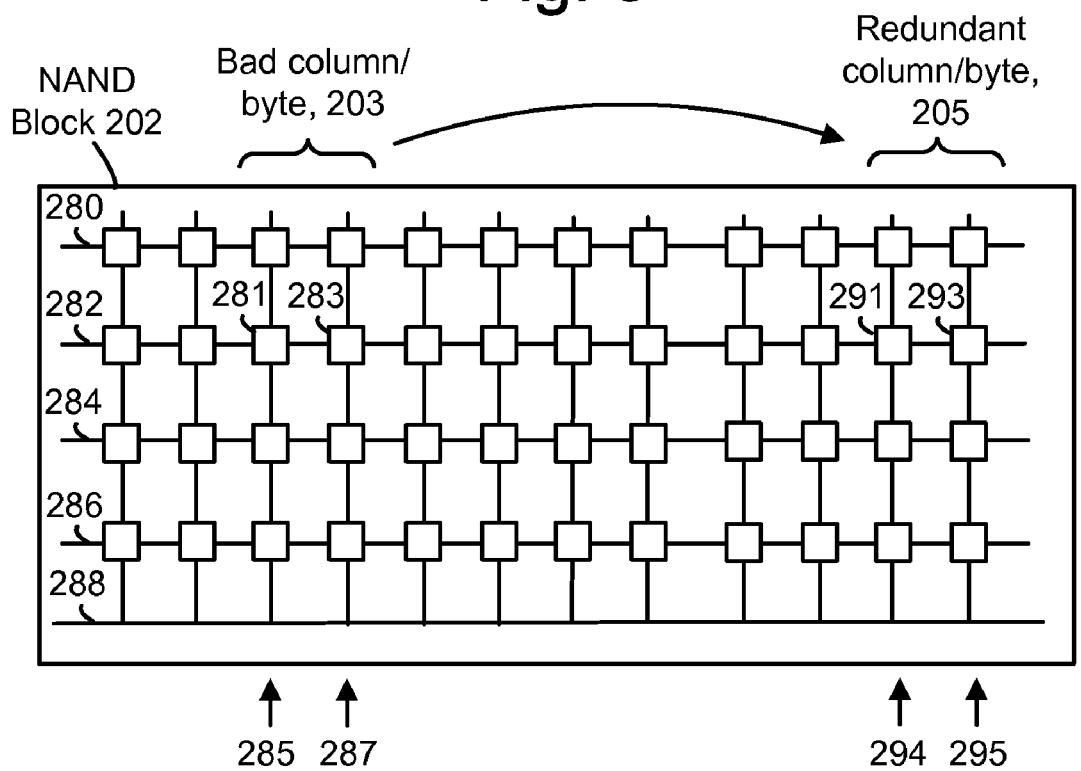
FIG. 3 depicts remapping of a non-redundant column to a redundant column in a NAND block.

FIG. 3 depicts remapping of a non-redundant column to a redundant column in a NAND block. Recall that in a NAND block, the remapping is within a physical block. NAND block 202 includes an array of non-redundant and redundant columns. The physical block includes example storage elements and select gate transistors, represented by squares, which are series-connected in a column, and connected to an associated word line in a row. The block includes an SGD line 280, word lines 282 and 284, an SGS line 286 and a source line 288, as a simplified illustration. In this example, there is a bad storage element 281 in string 285, and a bad storage element 283 in string 287, and there are four bits stored per storage element. The strings 285 and 287 are in a bad column/byte 203. Thus, a byte redundancy approach, for instance, requires replacing two strings of storage elements, namely strings 285 and 287 with strings 294 and 295, respectively. Strings 294 and 295 are in a redundant column/byte 205. Storage elements 281 and 283, which are arranged on the same word line 282, store one byte, and all like-positioned storage elements which are arranged on the same string as these storage elements are replaced. Storage elements 281 and 283 are replaced by storage elements 291 and 293, respectively.

Figure 4A:
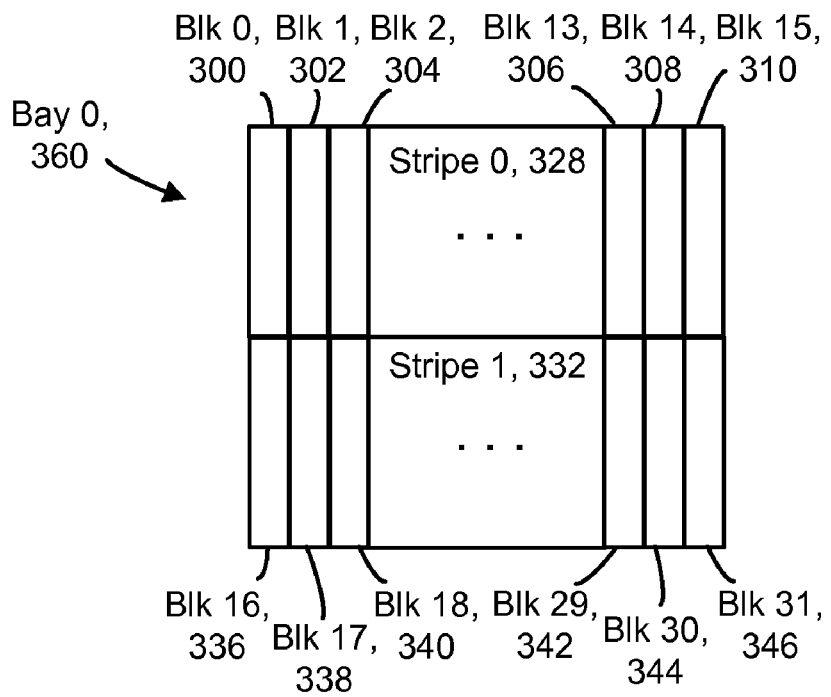
FIG. 4a depicts an example of storage elements arranged in a bay in a 3-D memory device.

FIG. 4a illustrates an example of storage elements arranged in a bay in a 3-D memory device. In contrast to a NAND block, discussed previously, in a 3-D memory device, a logical block is generally composed of multiple physical blocks, where each physical block is composed of a set of unbroken word lines and bit lines. In other words, a logical block is composed of multiple physical blocks which collectively store a page of data. Further, there is no relationship between the unit of erase and physical or logical blocks. Normally, a unit of erase can be a single page or a group of multiple pages in a 3D memory.

In a 3-D memory device, the storage elements may be organized into a number of bays, such as 16, 32 or 64 bays of a memory device, where each bay includes, e.g., 32 physical blocks. Further, the physical blocks may be arranged in, e.g., two rows or stripes of 16 blocks each. Additionally, spare or redundant blocks may be provided which can be used by neighboring bays. Each bay may be considered to have an array of storage elements. Typically there are fewer physical blocks in a 3-D device than in a NAND device. Each physical block can be considered to be a memory array which includes non-redundant columns of storage element and redundant columns of storage elements.

For example, Bay 0 (360) includes Stripe 0 (328) and Stripe 1 (332). Stripe 0 includes blocks 0-15, including Blk 0 (300), Blk 1 (302), Blk 2 (304), . . . , Blk 13 (306), Blk 14 (308) and Blk 15 (310). Stripe 1 includes blocks 16-31, including Blk 16 (336), Blk 17 (338), Blk 18 (340), . . . , Blk 29 (342), Blk 30 (344) and Blk 31 (346).

FIG. 4*b* depicts a set of sixteen bays of storage elements in a 3-D memory device. Specifically, Bay 0 (360) is provided, in addition to Bay 1 (400), Bay 2 (410), Bay 3 (415), Bay 4 (420), Bay 5 (425), Bay 6 (430), Bay 7 (435), Bay 8 (440), Bay 9 (445), Bay 10 (450), Bay 11 (455), Bay 12 (460), Bay 13 (465), Bay 14 (470) and Bay 15 (475).

Word lines which are associated with storage elements extend in horizontal rows across the bays. Typically, a common range of word line numbers is used for each stripe or bay. However, different physical conductive lines of the word lines are arranged in the different bays. In one possible approach, when a particular logical block is accessed, the like-numbered physical block in each of the bays is accessed. For example, accessing logical block 0 includes accessing physical block 0 in each of bays 0 through 15. Each physical block 0 is shown with a cross-hatched pattern. In this way, a page can be distributed among different locations.

Figure 5A:
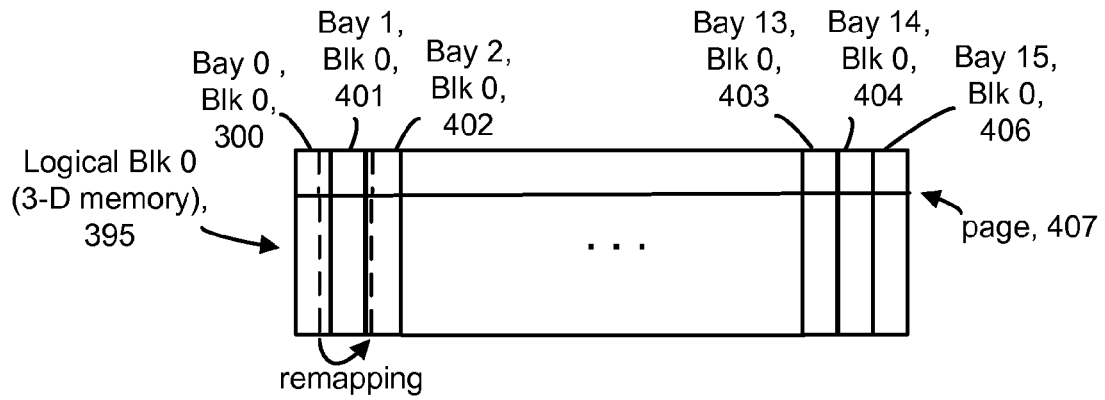
FIG. 5a depicts remapping of a non-redundant column to a redundant column within a 3-D logical block.

FIG. 5*a* depicts remapping of a non-redundant column to a redundant column in a 3-D logical block. A logical Blk 0 (395) of a 3-D memory device is composed of physical Blk 0 from each bay, namely, Bay 0, Blk 0 (300), Bay 1, Blk 0 (401), Bay 2, Blk 0 (402), . . . , Bay 13, Blk 0 (403), Bay 14, Blk 0 (404), and Bay 15, Blk 0 (406). These are the physical blocks in FIG. 4*b* with the cross-hatched pattern. For a 3-D memory device, a page 407 is distributed in different physical blocks, but redundant bytes are read out with normal bytes, such as by multiplexing the bad bytes based on the CAM content. Redundant bytes in a logical block can replace bad bytes in the same logical block, but redundant bytes and normal bytes can belong to different physical blocks of a logical block. A page is distributed in multiple physical blocks and redundant bytes will end up in some physical blocks. As the page is read out, all bytes (normal and redundant) end up in a page register, after which byte replacement occurs. There is no constraint imposed regarding the physical location of the redundant bytes relative to the bad bytes, as long as they belong to the same logical block.

For 3-D memory devices, redundant and non-redundant columns are mapped across physical blocks of a logical block, and redundant columns in one or more physical blocks can be used as replacements for bad columns in one or more other physical blocks.

Figure 5B:
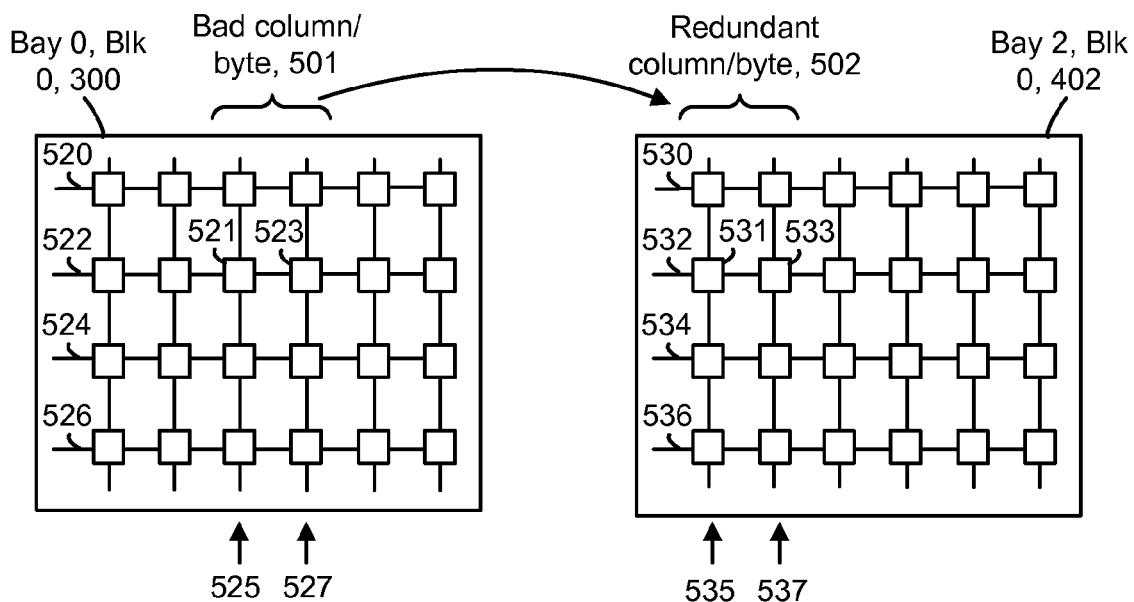
FIG. 5b depicts details of remapping of a non-redundant column to a redundant column within a 3-D logical block.

The remapping of FIG. 5*a* is discussed in further detail in FIG. 5*b*. In comparison to the NAND device of FIG. 3, a 3-D memory device does not have drain and source select gates or a common source line. Each square in FIG. 5*b* conceptually denotes a storage element. Bay 0, Blk 0 (300) includes word lines 520, 522, 524 and 526, and Bay 2, Blk 0 (402) includes word lines 530, 532, 534 and 536. In this example, bad storage elements 521 and 523 are present in bitlines 525 and 527, respectively. The bitlines 525 and 527 are in a bad column/byte 501. The byte redundancy approach replaces multiple bitlines of storage elements. For example, bitlines 525 and 527 are replaced with bitlines 535 and 537, respectively, of Bay 2, Blk 0 (402). The bitlines 535 and 537 are in a redundant column/byte 502. Storage elements 521 and 523 are replaced by storage elements 531 and 533, respectively.

As mentioned at the outset, precious space in a memory device is consumed by column redundancy data in volatile storage. Column redundancy data is stored in a non-volatile memory location of a memory device at the time of manufacture, based on testing which identifies which columns of storage elements need to be replaced by redundant columns of storage elements. Typically, when the memory device is powered on, the column redundancy data which acts on the entire memory device is loaded to a volatile memory location of the memory device such as a special type of RAM. This memory location is also referred to as a content-addressable memory (CAM). This approach requires the CAM to be large enough to store the maximum allowable number of entries. Once the column redundancy data is loaded in, it can be used to allow write and read operations to occur in which the redundant columns of storage elements are used in place of the bad columns of storage elements. However, as the number of storage elements in a memory device increases, and the size of the memory device decreases, it becomes increasingly important for the available space in the memory device, e.g., on the chip, to be used as efficiently as possible. A strategy provided herein allows use of a CAM which is smaller than the total number of entries of the column redundancy data which acts on the entire memory device.

In particular, the CAM can be loaded every time a new set of storage elements is accessed, where the size of the set can be configured according to the amount of column redundancy data. In one possible approach, the set encompasses one or more blocks of storage elements, e.g., an integer number $N \geq 1$ of logical blocks of storage elements on a common die.

The boundaries between sets can be defined based on boundaries between addresses of the one or more blocks, for instance. As long as the user is accessing pages for a given set, such as for write or read operations, the CAM will manage the column redundancy without being reloaded. If the user requests to access a page in a different set of storage elements, a boundary is crossed, and the CAM will be reloaded with the corresponding column redundancy data. In one possible approach, a controller (such as the controller 130 in FIG. 1) includes a state machine which is configured with hardware, software and/or firmware to perform the appropriate steps. Once the new column redundancy data is loaded, the different set of storage elements can be accessed.

Figure 6:
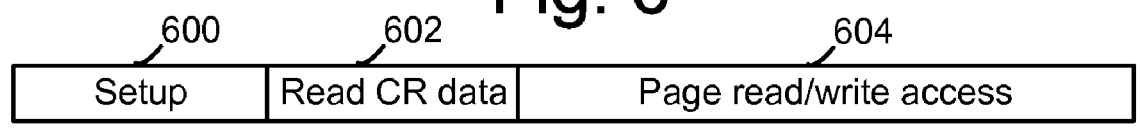
FIG. 6 depicts a time sequence for the first access in a block or other set of storage elements.

This approach has a bandwidth impact for the first access in a set of storage elements, as indicated in FIG. 6, which depicts a time sequence for the first access in a block or other set of storage elements. For example, a time duration 600 is used for a setup process in accessing the new set of storage elements. This setup does not involve the column redundancy data. A time duration 602 involves reading the column redundancy data, and represents a time overhead cost. A time duration 604 represents a normal page read/write access time. The time overhead cost is expected to be minimal in comparison to the benefit of using a substantially smaller CAM. Furthermore, the cost is lessened since the time to read and load a portion of the column redundancy data for a respective portion of the memory device is less than the corresponding time to read and load the column redundancy data for the entire memory device. Moreover, most of the time the memory is read in sequence, and boundaries between sets of storage elements are crossed infrequently. These are factors which minimize the overhead time. Moreover, as manufacturing processes improve and defect densities decrease, this strategy provides the flexibility of loading and managing the CR entries for different sized sets of storage elements. During the manufacturing process, it is often most practical to specify a fixed size for the volatile storage location which stores the CR data. In this case, in an early stage of manufacturing in the product lifecycle, there will be a relatively large number of defects per memory device. As a result, the size of the set of storage elements whose CR data is loaded together will be relatively smaller, such as one block. In a later stage of manufacturing, such as months or years later, there will be a relatively small number of defects per memory device. As a result, the size of the set of storage elements whose CR data is loaded together can be relatively larger, such as two, four or more blocks, as a result of which the time penalty for loading CR data is reduced. Eventually, if the amount of CR data becomes sufficiently small, it may be possible to load all CR data for the memory device into the reduced-size volatile storage location.

This approach has the advantage that it uses a substantially smaller CAM but can still cover a chip which has a high number of CR entries. For example, if we need coverage for a number N of defects in a memory device, a CAM which is large enough to store only, say M=10-20% of N entries, could be used, while maintaining a high probability of being able to repair all N defects. The byte redundancy data which is stored in the non-volatile memory location can thus provide redundancy for N defects in the memory device, where the volatile storage location is sized to store M<N entries to accommodate M defects, and M is an expected maximum number of defects per set for all sets of storage elements in the memory device.

Figure 7:
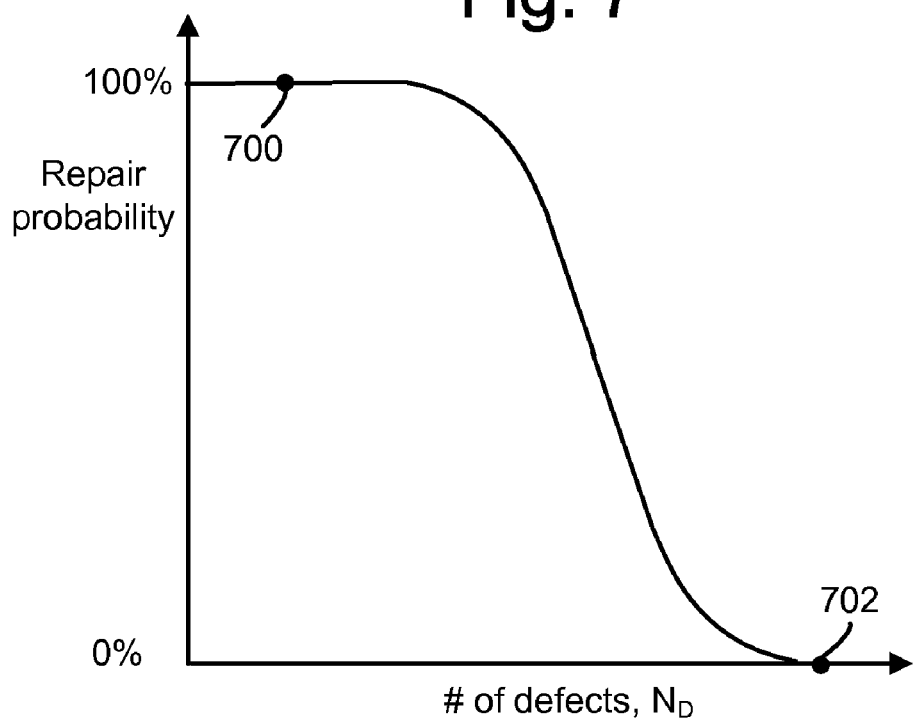
FIG. 7 depicts a repair probability versus a number of defects in a memory device.

FIG. 7 depicts a repair probability versus a number of defects N in a memory device. The repair probability refers to the probability that all defective storage elements in the memory device can be replaced by redundant storage elements. For example, assume that each block of storage elements includes redundant storage elements which can store data for up to 30 defects, and that there are 16 blocks in the memory device. If there are 30 defects in the entire memory device, a worst case scenario is that all 30 defects are in one block. In this case, it is still possible to repair these defects, so the probability of repair is 100% (point 700). If there are 31 defects in the entire memory device, a worst case scenario is that all 31 defects are in one block. In this case, it is not possible to repair these defects, so the probability of repair is less than 100%. However, the probability of this distribution is very small, so the probability of repair is still very close to 100%. If there are 481 defects in the entire memory device, the probability of repairing all defects is 0% (point 702) since at least one block will have 31 defects, which is more than can be fully repaired. Such a device might have to be discarded, if a 100% repair probability is required.

A number of defects between 30 and 481 will result in other intermediate probabilities between 100% and 0%. Testing can indicate how evenly distributed defects are in a memory device. In practice, a relatively even distribution of defects is usually seen among different blocks, so that a high repair probability can be realized with a relatively small CAM size. Generally, the CAM size can accommodate the same number of defects that one or more blocks can accommodate in their redundant storage elements.

The size of the CAM can be substantially reduced relative to the case where all CR entries are stored at once. In the above example, storing 30 entries instead of 480 results in a savings of 93% in the amount of data stored, which translates to a substantially physically smaller CAM. Power consumption can also be reduced.

FIG. 8 provides an example of column redundancy data for an entire memory chip which is organized based on a set size of one logical block. As an example, nine entries are provided as a subset of all entries, typically many hundreds. The CR data can include addresses of different sets of storage elements, such as different blocks, in the memory device. In this example, each logical block is a different set of storage elements, where a set refers to a group of storage elements which use commonly-loaded CR data in the volatile memory location. Here, entry 1 indicates that a block address 1 has a bad or defective byte of storage elements at byte address 34, which can be, e.g., the thirty-fourth byte in a page in the block. If there is more than one page per word line, a page address may also be used to differentiate the different pages. A redundant or replacement byte address of 1 indicates that a first redundant byte of a number of available redundant bytes is used to store data which would have otherwise been stored in the bad byte. Similarly, entry 2 indicates that block address 1 has a bad byte of storage elements at byte address 50. A redundant byte address of 2 indicates that a second redundant byte of a number of available redundant bytes is used to store data which would have otherwise been stored in the bad byte.

Entries 3-6 relate to defects which are in a second set of storage elements, which corresponds to a second logical block, in this example. Specifically, entry 3 indicates that, for block address 2, a bad byte of storage elements at byte address 412 is replaced using redundant byte address 1 for the block. Entry 4 indicates that, for block address 2, a bad byte of storage elements at byte address 413 is replaced using redundant byte address 2 for the block. Entry 5 indicates that, for block address 2, a bad byte of storage elements at byte address 414 is replaced using redundant byte address 3 for the block. Entry 6 indicates that, for block address 2, a bad byte of storage elements at byte address 995 is replaced using redundant byte address 4 for the block. In this case, three adjacent bytes have defects, again as an illustration only.

Entries 7-9 relate to defects which are in a third set of storage elements, which corresponds to a third logical block, in this example. Specifically, entry 7 indicates that, for block address 3, a bad byte of storage elements at byte address 12 is replaced using redundant byte address 1 for the block. Entry 8 indicates that, for block address 3, a bad byte of storage elements at byte address 14 is replaced using redundant byte address 2 for the block. Entry 9 indicates that, for block address 3, a bad byte of storage elements at byte address 1469 is replaced using redundant byte address 3 for the block. Additionally entries, not shown, relate to block 4 and subsequent blocks. The horizontal lines represent address boundaries between the different sets to denote which CR data is concurrently loaded.

The byte redundancy data for a particular set provides an address of at least one defective byte of storage elements of the particular set, and an address of at least one associated replacement byte of storage elements. The address can include a byte address.

As mentioned, a non-volatile storage location 128 (FIG. 1) can store column redundancy data for the entire memory device. Or, different non-volatile storage locations can store column redundancy data for different portions of the entire memory device. For example, there can be one non-volatile storage location per logical block. A common volatile storage location can be shared by the multiple sets. The non-volatile storage location can be provided, e.g., as part of a memory array 102 (FIG. 1), in one or more specified pages of storage elements, or in ROM or flash fuses. For instance, a ROM area can be provided in the memory array or separate from the memory array. The CR data could also be maintained in a header or spare portion of the memory array. The column redundancy data identifies bad bytes and respective redundant bytes. The redundant bytes are used internally by the controller, and are not addressed as replacement bytes from outside of the memory device. The controller can read the CR data from the non-volatile storage location into a pointer structure which is consulted during a read or write process. When a logical address from the host corresponds to a bad byte, the address of a replacement byte is substituted and sent along the address lines to the column control circuits. This substitution is transparent to the user/host.

In each column redundancy entry a sufficient number of bytes can be allocated in which specific ranges of bits are used to identify each set/block, bad bytes and redundant bytes. For example, a first number of bits can be used to represent a block in the memory device, a second number of bits can be used to represent a page in a word line if there are multiple pages per word line, a third number of bits can be used to represent a byte in a page, and a fourth number of bits can be used to represent a position of a redundant byte. Assume an example with one page per word line, 32 blocks in a memory device, 2048 bytes per page and 16 extra bytes. Each column redundancy entry can then include five bits to identify a block (since $2^5$=32), eleven bits to identify a non-redundant byte (since $2^{11}$=2048) and four bits to identify a redundant byte (since $2^4$=16). That is a total of twenty bits. In practice, three bytes can be allocated. Note that if a separate volatile storage is provided for each block, for instance, the entries do not have to identify the block, and can thus use fewer bits.

FIG. 9 provides an example of retrieved column redundancy data which is loaded to a volatile storage location when accessing a particular set of storage elements, such as set/block 3, referred to in FIG. 8. In this case, the three entries which relate to logical block 3 are loaded. In one possible approach, the controller provides at least one read command to the volatile storage locations which distinguishes a portion of the non-volatile storage location in which the byte redundancy data for the particular set is stored from other portions of the non-volatile storage location in which the byte redundancy data for the other sets of storage elements is stored. The byte redundancy data for the particular set can thus be loaded from the non-volatile storage location of the memory device to a volatile storage location of the memory device, without loading byte redundancy data for other sets of storage elements of the memory device. The storage elements in the particular set can then be accessed using the byte redundancy data for the particular set.

Moreover, as mentioned, the size of a set of storage elements which use commonly-loaded CR data can be configured to an optimal level. Generally, the size of the set will be relatively smaller when the number of defects in the memory device (e.g., the defect density) is relatively higher. In FIGS. 8 and 9, a unit size of one logical block is used. In FIGS. 10 and 11, a unit size of two logical blocks is used. Note that it is also conceivable to use varying unit sizes concurrently for a memory device, such as when the defects are non-uniformly distributed in a known manner. In such cases, a relatively smaller set can be used for regions of storage elements which have a relatively higher defect density, and a relatively larger unit can be used for regions of storage elements which have a relatively lower defect density. For example, assume it is known that the first and last blocks of a memory device tend to have relatively more defects than the remaining blocks, in which defects are more evenly distributed. In this case, it is possible to use a set size of one block for each of the first and last blocks, and a set size of two blocks for the remaining blocks. Defects may be unevenly distributed in different regions of a memory device, such as different levels of a multi-level device. Note that the volatile storage can have empty entries if there are not that many defects.

FIG. 10 provides an example of column redundancy data for an entire memory chip which is organized based on a set size of two logical blocks. As an example, nine entries are provided as a subset of all entries. In this example, every two blocks are in a different set of storage elements.

Entries 1-4 relate to defects which are in a first set of storage elements, which corresponds to logical blocks 1 and 2, in this example. Specifically, entry 1 indicates that, for block address 1, a bad byte of storage elements at byte address 75 is replaced using redundant byte address 1 for the block. Entry 2 indicates that, for block address 1, a bad byte of storage elements at byte address 349 is replaced using redundant byte address 2 for the block. Entry 3 indicates that, for block address 2, a bad byte of storage elements at byte address 584 is replaced using redundant byte address 1 for the block. Entry 4 indicates that, for block address 2, a bad byte of storage elements at byte address 1200 is replaced using redundant byte address 2 for the block.

Entries 5-7 relate to defects which are in a second set of storage elements, which corresponds to logical blocks 3 and 4, in this example. Specifically, entry 5 indicates that, for block address 3, a bad byte of storage elements at byte address 67 is replaced using redundant byte address 1 for the block. Entry 6 indicates that, for block address 3, a bad byte of storage elements at byte address 68 is replaced using redundant byte address 2 for the block. Entry 7 indicates that, for block address 4, a bad byte of storage elements at byte address 185 is replaced using redundant byte address 1 for the block.

Entries 8 and 9 relate to defects which are in a third set of storage elements, which corresponds to logical blocks 5 and 6, in this example. Specifically, entry 8 indicates that, for block address 5, a bad byte of storage elements at byte address 98 is replaced using redundant byte address 1 for the block. Entry 9 indicates that, for block address 6, a bad byte of storage elements at byte address 832 is replaced using redundant byte address 1 for the block. Additionally entries, not shown, relate to block 7 and subsequent blocks. As before, the horizontal lines represent address boundaries between the different sets to denote which CR data is concurrently loaded.

FIG. 11 provides an example of retrieved column redundancy data which is loaded to a volatile storage location when accessing a particular set of storage elements, such as set 2/blocks 3 and 4, referred to in FIG. 10. In this case, the three entries which relate to set 2 are loaded.

Figure 12:
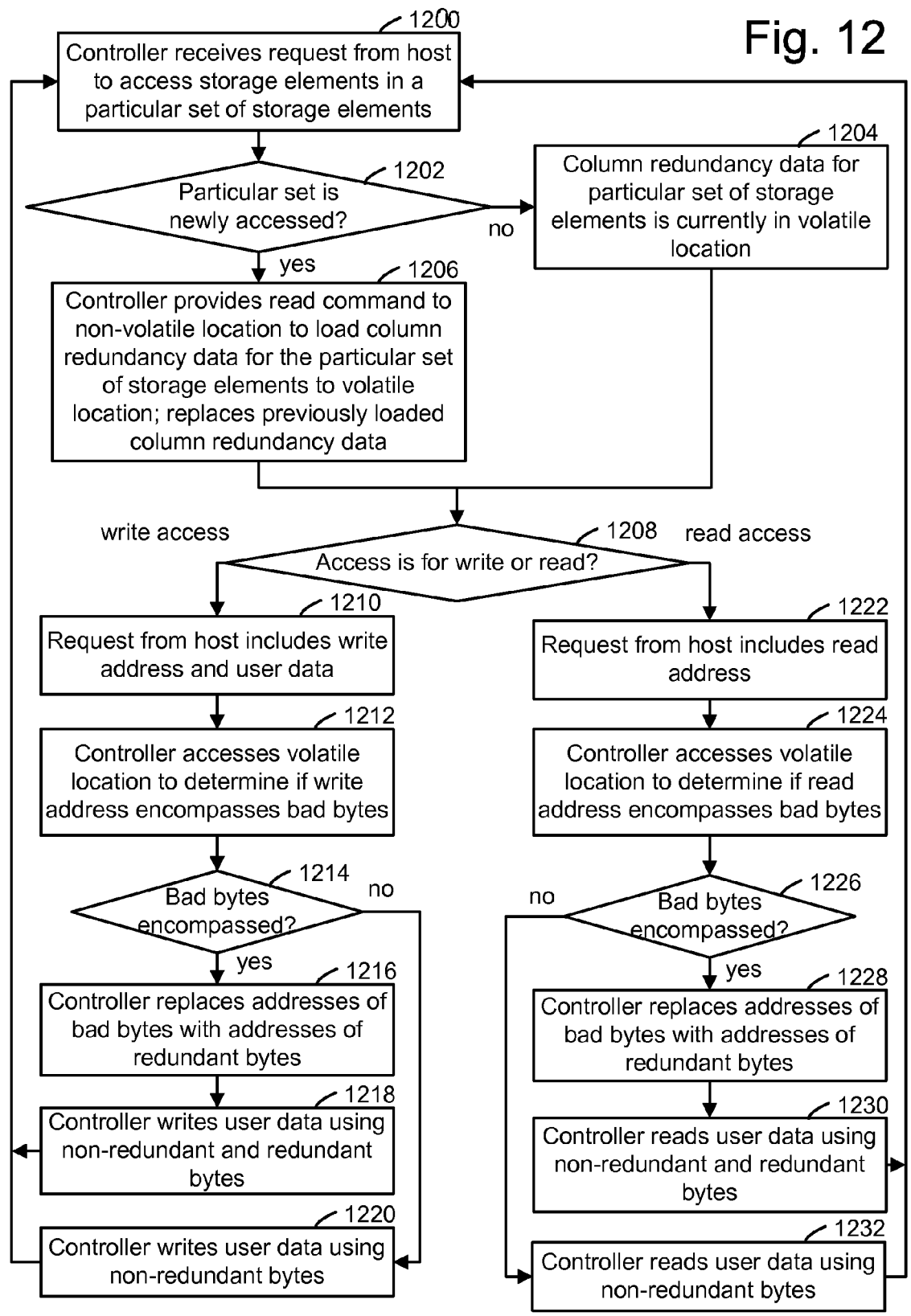
FIG. 12 depicts a process for selectively loading column redundancy data based on an accessed set of storage elements.

FIG. 12 depicts a process for selectively loading column redundancy data based on an accessed set of storage elements. At step 1200, a controller (such as controller 130 of FIG. 1) receives a request from a host (such as host 136) to access storage elements in a particular set of storage elements. The access can be a write or read command, for instance. Note that the request may specifically identify the particular set of storage elements which is defined for purposes of loading CR data, or a subset/portion of the set.

At step 1202, a determination is made as to whether the set is newly accessed, that is, accessed after another set which is defined for purposes of loading CR data has been accessed. If the set is newly accessed, the controller provides a read command to the non-volatile location to load the column redundancy data for the particular set of storage elements to a volatile location 134 (FIG. 1). Thus, we reload the volatile storage location with new byte redundancy data each time a different set of storage elements is accessed, thereby replacing any column redundancy data which was previously stored in the volatile storage location.

If the set is not newly accessed, the column redundancy data for the particular set of storage elements is currently in the volatile memory location and therefore does not need to be loaded.

At decision step 1208, if the access request is for a write access, the request from the host includes a write address, such as a block and page address, and user data to be written to the memory array (step 1210). At step 1212, the controller accesses the volatile location to determine if the write address encompasses bad bytes. For example, if the request is to write to block 3, at bytes 0-2047 (two kilobytes), using the column redundancy data of FIG. 9, for instance, it can be determined that bad bytes 12, 14 and 1469 are encompassed. At decision step 1214, if bad bytes are encompassed, the controller replaces the addresses of the bad bytes with the addresses of the redundant bytes (step 1216). For example, addresses of bad bytes 12, 14 and 1469 could be replaced by addresses of redundant bytes 1, 2 and 3, respectively. At step 1218, the controller writes the user data using the non-redundant and redundant bytes. For example, the non-redundant bytes are bytes 1-11, 13, 15-1468 and 1470-2047 of block 3. If no bad bytes are encompassed in the write request at decision step 1214, the controller writes the user data using only the non-redundant bytes, at step 1220.

If a read request is detected at decision step 1208, the request from the host includes a read address, such as a block and page address of user data which is to be read from the memory array (step 1222). At step 1224, the controller accesses the volatile location to determine if the read address encompasses bad bytes. At decision step 1226, if bad bytes are encompassed, the controller replaces the addresses of the bad bytes with the addresses of the redundant bytes (step 1228). At step 1230, the controller reads the user data using the non-redundant and redundant bytes. If no bad bytes are encompassed in the read request at decision step 1226, the controller reads the user data using only the non-redundant bytes, at step 1232.

After step 1218, 1220, 1230 or 1232, a subsequent request from the host may be received at step 1200, in which case processing proceeds again as discussed.

As a result, column redundancy data is loaded only when a new set of storage elements is accessed, where a set is defined to encompass a group of storage elements for which column redundancy data is concurrently loaded. The set size can be one or more blocks, in one possible approach, and can be based on the definition of a block and the memory device type. For example, there are typically fewer blocks in a 3-D device than in a NAND device. Further, the block or set can represent a logical or physical grouping of storage elements.

Figure 13:
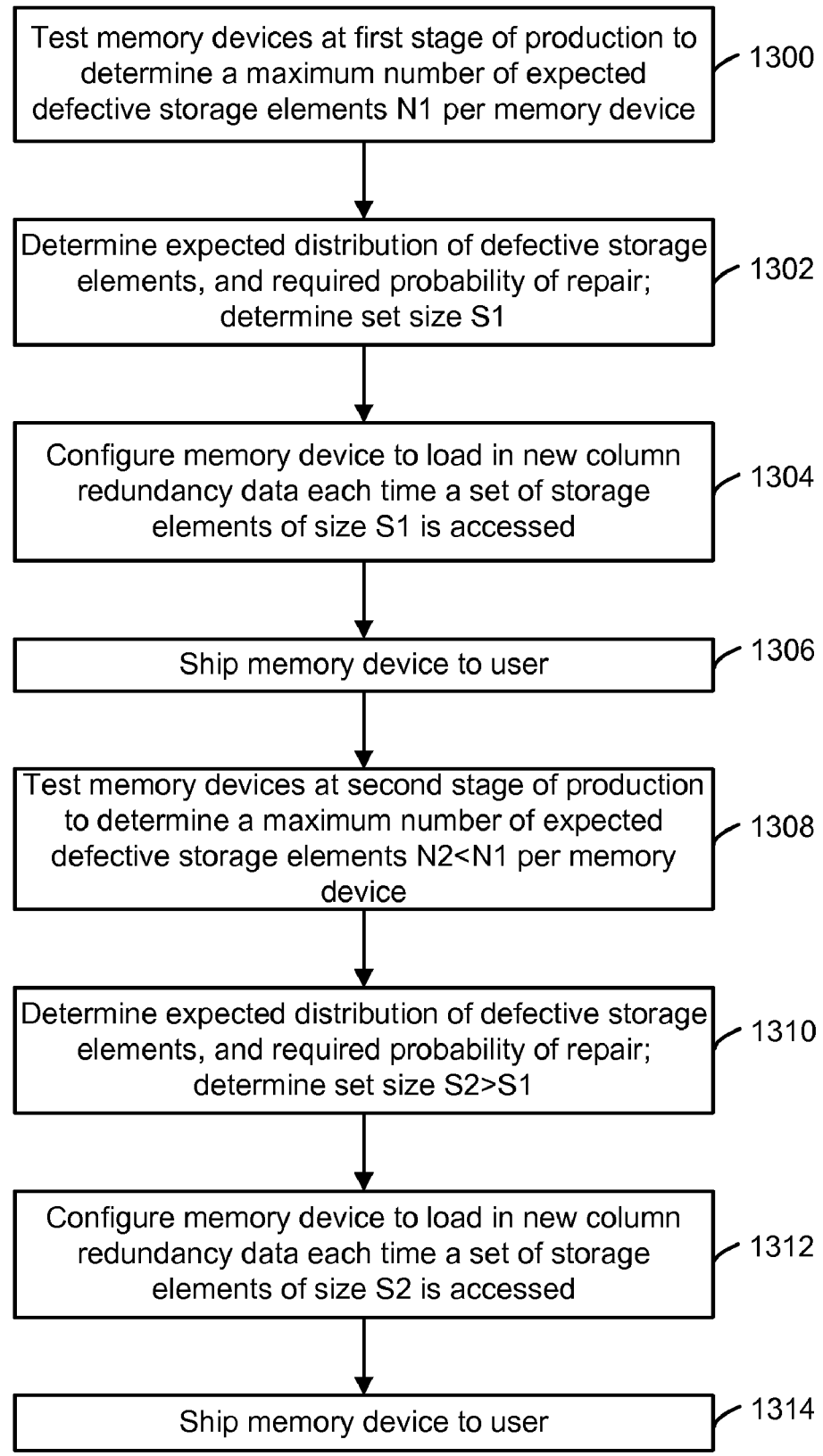
FIG. 13 depicts a process for configuring a memory device to access column redundancy data.

FIG. 13 depicts a process for configuring a memory device to access column redundancy data. As mentioned, manufacturing processes typically improve as a memory device is repeatedly manufactured over time due to refinements in the manufacturing process and materials. As a result, defect densities tend to decrease over time. This fact can be used to adjust the parameters for loading new configuration data so that it is loaded less frequently when there are fewer defects. In other words, the size of the sets of storage elements for which column redundancy data is commonly loaded can be increased as defects per device decrease. This provides flexibility to reduce overhead time costs as defects per device decrease. It is also possible to change the memory device design to use a smaller volatile storage location for the CR data.

Initially, a certain storage capability is specified for the volatile storage location of the CR data, in addition to the number of redundant storage elements. Step 1300 includes testing memory devices at a first stage of production to determine a maximum number of expected defective storage elements N1 per memory device. Typically, a sampling is made of the memory devices and a statistical measure such as a median or average number of defects per device can be determined. Step 1302 includes determining an expected distribution of the defective storage elements, a required probability of repair, and a resulting set size S1. Step 1304 includes configuring the memory device to load in new column redundancy data each time a set of storage elements of size S1 is accessed. This can include setting, hardware, software and/or firmware such as in the system control logic, to achieve the desired functionality. Note that the configured memory devices need not each be tested as data from other devices can be relied on. Thus, for a given memory device, S1 can be set based on the average number of defects over several devices, or the actual measured number of defects for the particular device. Step 1306 includes shipping the memory device to the user.

Step 1308 includes testing memory devices at a second stage of production to determine a maximum number of expected defective storage elements N2<N1 per memory device. This could be, e.g., several months after the first stage. Step 1310 includes determining an expected distribution of the defective storage elements, a required probability of repair, and a resulting set size S2>S1. Step 1312 includes configuring a memory device to load in new column redundancy data each time a set of storage elements of size S2 is accessed. Thus, the set size is adjusted according to the defect density of the manufacturing process. The different memory devices which are configured in steps 1304 and 1312, e.g., first and second memory devices, respectively, both can include a volatile memory location having a common storage size for storing byte redundancy data. Step 1314 includes shipping the memory device to the user.

The set size can be adjusted further in additional stages of production. Thus, we can dynamically change the criteria for loading column redundancy data according to the defect level that is seen during fabrication, so that the loading occurs less frequently as the defect level decreases.

The memory devices can have an option enabled that will use the CAM in a different way such as by reloading it less frequently. That option can be set by hardware, software and/or firmware. It is an option that is enabled at the time of the sort. When the chips are produced and tested, the option is set before they are delivered to the end user. Thus, two identical chips can behave in different ways if they have different options enabled. The techniques provided herein apply to different types of memories, including rewritable memories and write-once memories, which use column redundancy/byte redundancy features.

FIG. 14*a* depicts a first logical block which stores column redundancy data for first and second blocks. The logical block is a conceptual, not physical construct. In particular, a first logical block B1 1400 includes non-redundant columns 1420 and redundant columns 1430, and has an associated non-volatile storage 1410 which stores column redundancy data for a set of multiple blocks, such as the first logical block B1 1400 itself and a second logical block B2. Column redundancy data for more than two blocks could also be provided.

FIG. 14*b* depicts a second logical block which stores column redundancy data for first and second blocks. In particular, the second block B2 1450 includes non-redundant columns 1470 and redundant columns 1480, and has an associated non-volatile storage 1460 which stores column redundancy data for a set of multiple blocks, such as the first block B1 1400 and the second block B2. Each block has associated CR data for itself and one or more other blocks such that the CR data for a set of blocks is stored redundantly in a non-volatile location of each block.

For instance, there could be two additional logical blocks B3 and B4, where a non-volatile storage location of B3 stores CR data for a set of B3 and B4, and a non-volatile storage location of B4 stores the CR data for the set of B3 and B4. When accessing B1 or B2, their CR data is loaded but not the CR data for the set of B3 and B4 or any other blocks. When accessing B3 or B4, their CR data is loaded but not the CR data for the set of B1 and B2 or any other blocks.

Generally, when the CR data is stored in the logical block being accessed, there can be a benefit in replicating the CR data when it is combined for many blocks. For example, if we have a set size of two blocks, B1 and B2, we calculate the redundancy data for blocks B1 and B2, and store it in a special location (duplicated) in both block B1 and block B2. If the user first accesses block B1, we read the CR data contained in block B1 into the volatile storage location. However, this CR data is the CR data for the set of block B1 and block B2. Thus, block B2 can also be accessed without reloading the CR data. Blocks B1 and B2 can be accessed repeatedly, switching and back and forth between them, without reloading the CR data.

Similarly, if the user first accesses block B2, the CR data for the set of block B1 and B2 will be loaded to the volatile storage location from the non-volatile location in block B2. The CR data will be the same as in the previous case. Again, no reload is need as long as the read and write operations involve only blocks B1 and B2. Advantageously, the CR data read time 602 (FIG. 6) is incurred only once for multiple blocks, instead of once for each block. The setup time is a constant overhead to access a block. Since a normal data read or write occurs on a specific block, we can incur the CR data read time for that block and avoid incurring the CR data read time again while still being able to access one or more additional blocks in a set.

FIG. 15 depicts a majority voting process for CR data. As mentioned, CR data can be stored in various non-volatile locations in a memory device. In a further aspect, the CR data is stored in a redundant manner. For example, CR data can be distributed in non-volatile locations of multiple physical/logical blocks. In the arrangement of FIG. 4, for example, the same byte of CR data can be stored in each of Bays 0-7 in the same numbered physical block, e.g., the CR data for logical Block 0 can be stored in physical Block 0 of each of Bays 0-7, the CR data for logical Block 1 can be stored in physical Block 1 of each of Bays 0-7, and so forth. Thus, CR data bytes can be repeated and stored in different locations of the memory device, such as different physical blocks in different bays.

CR byte copies 1500, 1505, 1510, 1515, 1520, 1525, 1530 and 1535 are depicted. The byte copies can be stored in different physical blocks. A value can be assigned to each bit position based on the value of the bit position in a majority of the bytes, in a majority vote process 1540. For example, assuming bit positions 0-7 starting from the rightmost bit, Bit 0=1, 1, 0, 1, 1, 1, 1 and 1 in the bytes 1500, 1505, 1510, 1515, 1520, 1525, 1530 and 1535, respectively. Since the value 1 occurs seven times and the value 0 occurs once, the value 1 is assigned to Bit 0. The bit value which appears the majority of the time among the redundant bytes is assigned to the bit position. The redundant bytes can differ due to bad storage elements, read or write errors and the like. As another example, Bit 1=0, 0, 0, 1, 0, 1, 1 and 0 in the bytes 1500, 1505, 1510, 1515, 1520, 1525, 1530 and 1535, respectively. Since the value 1 occurs three times and the value 0 occurs five times, the value 0 is assigned to Bit 1. The procedure can proceed accordingly for each bit position.

This procedure uses a type of a redundancy code and can be implemented with relatively straightforward logic so it is fast to read and write. In contrast, other error correction techniques such as those involving check bit or error correction codes are more complex and expensive to implement. A further advantage is that the bytes can be far from each other in the memory device, such as on separate physical blocks that are connected to separate voltage driving and other peripheral circuitry. So, if one location is compromised, a valid copy of the byte can still be read from another location. A redundancy of eight bytes is an example only.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method for operating a memory device, comprising:
in response to a request to access storage elements in a particular set of storage elements of the memory device, loading byte redundancy data for the particular set from at least one non-volatile storage location of the memory device to a volatile storage location of the memory device, without loading byte redundancy data for other sets, the at least one non-volatile storage location stores byte redundancy data for the particular set and for other sets of storage elements of the memory device, the byte redundancy data for the particular set and for the other sets provides redundancy for N defects, the volatile storage location is sized to store M<N entries to accommodate M defects, and M and N are integers greater than one; and
accessing the storage elements in the particular set using the byte redundancy data for the particular set.

2. The method of claim 1, further comprising:
in response to a request to access storage elements in an additional set of storage elements which is part of the other sets of storage elements, loading byte redundancy data for the additional set to the volatile storage location, the byte redundancy data for the additional set replaces the byte redundancy data for the particular set; and
accessing the storage elements in the additional set using the byte redundancy data for the additional set.

3. The method of claim 1, wherein the at least one non-volatile storage location comprises multiple non-volatile storage locations of the memory device, and the byte redundancy data for the particular set comprises redundant bytes which are loaded from the multiple non-volatile storage locations of the memory device, the method further comprising:
performing a majority voting process to ascertain bit values of the redundant bytes.

4. The method of claim 1, wherein:
the byte redundancy data for the particular set provides an address of at least one defective byte of storage elements of the particular set, and an address of at least one associated replacement byte of storage elements.

5. The method of claim 4, wherein:
the address includes a byte address.

6. The method of claim 1, wherein:
M is an expected maximum number of defects per set for all sets of storage elements in the memory device.

7. The method of claim 1, wherein:
a definition of which storage elements are included in the particular set of storage elements and the other sets of storage elements is configurable in the memory device.

8. The method of claim 1, further comprising:
reloading the volatile storage location with new byte redundancy data each time a different set of storage elements is accessed.

9. The method of claim 1, wherein:
each set comprises one or more logical blocks of storage elements on a common die.

10. The method of claim 1, wherein:
the accessing of the storage elements in the particular set comprises at least one of reading and writing.

11. The method of claim 1, wherein:
the storage elements are non-volatile storage elements.

12. A memory device, comprising:
a plurality of sets of storage elements, including a particular set of storage elements and other sets of storage elements;
at least one non-volatile storage location which stores byte redundancy data for the particular set and for the other sets, the byte redundancy data for the particular set and for the other sets provides redundancy for N defects;
a volatile storage location which is sized to store M<N entries to accommodate M defects, where M and N are integers greater than one; and
at least one control circuit, the at least one control circuit: (a) receives a request to access storage elements in the particular set, and (b) in response to the request, (i) loads byte redundancy data for the particular set from the at least one non-volatile storage location to the volatile storage location, without loading byte redundancy data for the other sets of storage elements, and (ii) accesses the storage elements in the particular set using the byte redundancy data for the particular set.

13. The memory device of claim 12, wherein:
the plurality of sets of storage elements and the at least one non-volatile storage location are on a chip; and
the volatile storage location is off the chip.

14. The memory device of claim 13, wherein:
the at least one control circuit comprises a controller which is off the chip.

15. The memory device of claim 12, wherein:
the plurality of sets of storage elements and the at least one non-volatile storage location are on a chip in a memory array.

16. The memory device of claim 15, wherein:
the plurality of sets of storage elements are in non-redundant columns of the memory array, and the at least one non-volatile storage location is in redundant columns of the memory array.

17. The memory device of claim 12, wherein:
the request to access storage elements in the particular set of storage elements is a read or write request which is received from a host.

18. The memory device of claim 12, wherein:
M is an expected maximum number of defects per set for all sets of storage elements in the memory device.

19. The memory device of claim 12, wherein:
the at least one control circuit reloads the volatile storage location with new byte redundancy data each time a different set of storage elements is accessed.

20. The memory device of claim 12, wherein:
the storage elements are non-volatile storage elements.

* * * * *